US012003188B2

(12) United States Patent
Zhao et al.

(10) Patent No.: US 12,003,188 B2
(45) Date of Patent: Jun. 4, 2024

(54) MODULAR PARALLEL HALF-BRIDGE INTEGRATED ASSEMBLY WITH ANNULAR LAYOUT

(71) Applicant: BEIJING PESIT POWER INTEGRATION TECHNOLOGY COMPANY LIMITED, Beijing (CN)

(72) Inventors: Haijun Zhao, Beijing (CN); Guangfeng Xie, Beijing (CN)

(73) Assignee: BEIJING PESIT POWER INTEGRATION TECHNOLOGY COMPANY LIMITED, Beijing (CN)

( * ) Notice: Subject to any disclaimer, the term of this patent is extended or adjusted under 35 U.S.C. 154(b) by 204 days.

(21) Appl. No.: 17/844,748

(22) Filed: Jun. 21, 2022

(65) Prior Publication Data

US 2022/0321023 A1 Oct. 6, 2022

Related U.S. Application Data

(63) Continuation-in-part of application No. PCT/CN2020/139072, filed on Dec. 24, 2020.

(30) Foreign Application Priority Data

Dec. 24, 2019 (CN) .......................... 201911348159.1

(51) Int. Cl.
*H02M 7/04* (2006.01)
*H01L 23/367* (2006.01)
(Continued)

(52) U.S. Cl.
CPC .......... *H02M 7/003* (2013.01); *H01L 23/367* (2013.01); *H02M 7/5387* (2013.01); *H05K 1/181* (2013.01)

(58) Field of Classification Search
CPC .... H02M 7/003; H02M 7/219; H02M 7/5387; H05K 1/181; H01L 23/367
See application file for complete search history.

(56) References Cited

U.S. PATENT DOCUMENTS 7,619,325 B1 11/2009 Hennessy et al.
9,881,912 B2 1/2018 Takao et al.
(Continued)

FOREIGN PATENT DOCUMENTS

CN 102396141 A 3/2012
CN 105932016 A 9/2016
(Continued)

*Primary Examiner* — Gary L Laxton
(74) *Attorney, Agent, or Firm* — Bayramoglu Law Offices LLC

(57) ABSTRACT

A modular parallel half-bridge integrated assembly with an annular layout is provided. The assembly includes a plurality of parallel sub-modules to improve a current capacity of the assembly. The sub-modules adopt an annular layout and are connected in parallel to balance currents of the sub-modules. The half-bridge integrated assembly includes a plurality of sub-modules, a plurality of heat sinks, a drive board, a direct current (DC) positive collecting busbar, a DC negative collecting busbar, and an alternating current (AC) collecting busbar. According to the assembly, since each insulated gate bipolar transistor (IGBT) is tightly bound to a capacitor, parasitic inductance of a commutation loop is small, realizing a small voltage overshoot and a fast switching speed for the IGBT module, so as to balance the currents of the sub-modules.

9 Claims, 7 Drawing Sheets

(51) Int. Cl.
*H02M 7/00* (2006.01)
*H02M 7/5387* (2007.01)
*H05K 1/18* (2006.01)

(56) References Cited

U.S. PATENT DOCUMENTS

| | | |
|---|---|---|
| 2014/0226377 A1 | 8/2014 | Goetz et al. |
| 2014/0266325 A1* | 9/2014 | Tang .................... H03K 17/107 |
| | | 327/109 |
| 2016/0285445 A1 | 9/2016 | Takao et al. |
| 2016/0352327 A1 | 12/2016 | Wang |

FOREIGN PATENT DOCUMENTS

| | | |
|---|---|---|
| CN | 107818971 A | 3/2018 |
| CN | 110190756 A | 8/2019 |
| CN | 110336548 A | 10/2019 |
| CN | 110429850 A | 11/2019 |
| CN | 111030477 A | 4/2020 |
| EP | 3358738 A1 | 8/2018 |
| EP | 3544168 A1 | 9/2019 |

* cited by examiner

US 12,003,188 B2

MODULAR PARALLEL HALF-BRIDGE INTEGRATED ASSEMBLY WITH ANNULAR LAYOUT

CROSS REFERENCE TO THE RELATED APPLICATIONS

This application is a continuation-in-part application of International Application No. PCT/CN2020/139072, filed on Dec. 24, 2020, which is based upon and claims priority to Chinese Patent Application No. 201911348159.1, filed on Dec. 24, 2019, the entire contents of which are incorporated herein by reference.

TECHNICAL FIELD

The present disclosure relates to the technical field of power semiconductors, and specifically, to a modular parallel half-bridge integrated assembly with an annular layout.

BACKGROUND

Since the 1980s, with the rapid development of power electronic technologies, various power electronic devices have been used in industry more widely. With an increasing demand, the power electronic devices tend to have a large capacity and a high-power density so voltage and current levels of switching devices have also increased accordingly. Taking a widely used insulated gate bipolar transistor (IGBT) as an example, a high-power IGBT module with a voltage of 1,700-6,500 V and a current of 2,000-3,600 A has been widely used. Due to its large capacity, compact structure, double-sided heat dissipation, a failure short-circuit mode, and other advantages, a crimp-type encapsulated IGBT module has become a high-voltage high-power power electronic device suitable for a power system.

The IGBT module is a modular semiconductor product formed by bridging and encapsulating an IGBT chip and a freewheeling diode chip by using a specific circuit. The encapsulated IGBT module is directly applied to a frequency converter, an uninterrupted power system (UPS), and other devices.

At present, all crimp-type IGBT modules on the existing market are single-transistor devices. When a half-bridge circuit is formed, even if a component structure is compact enough, there is inevitably large parasitic inductance because a capacitor and the IGBT are large in size and the terminal of the capacitor is far away from two terminals of the IGBT, resulting in a large overvoltage when the IGBT module is turned off. This poses a threat to the application of the IGBT module and makes it difficult to further improve the capacity of the power electronic device.

The parasitic inductance forms a series resonant loop with the capacitor, which makes an actual capacitor resonate at a certain frequency. This phenomenon is referred to as self-resonance of the capacitor. In addition, in order to suppress a voltage spike of a switch transistor, it is necessary to reduce line stray inductance as much as possible and adopt a snubber circuit with appropriate structural parameters to suppress and absorb the overvoltage.

SUMMARY

To resolve the problems in the related art, the present disclosure provides a modular parallel half-bridge integrated assembly with an annular layout. The assembly also solves the problems of large parasitic inductance in a commutation loop of an existing parallel half-bridge integrated assembly and unbalanced currents of various sub-modules.

To achieve the above technical objective, the present disclosure adopts the following technical solutions:

A modular parallel half-bridge integrated assembly with an annular layout is designed that includes capacitors C4, C5, and C6, and sub-modules. The sub-modules each include an upper half-bridge IGBT, a lower half-bridge IGBT, and direct current (DC) capacitors. A positive terminal of the capacitor C4 is electrically connected to a first pin of an inductor L7. A second pin of the inductor L7 is electrically connected to a DC positive terminal of an IGBT T7. A DC negative terminal of the IGBT T7 is electrically connected to a first pin of an inductor L8. A second pin of the inductor L8 is electrically connected to an electrical node P2. The first pin of the inductor L8 is electrically connected to a DC positive terminal of an IGBT T8. A DC negative terminal of the IGBT T8 is electrically connected to a negative terminal of the capacitor C4. A positive terminal of the capacitor C5 is electrically connected to a first pin of an inductor L9. A second pin of the inductor L9 is electrically connected to a DC positive terminal of an IGBT T9. A DC negative terminal of the IGBT T9 is electrically connected to a first pin of an inductor L10. A second pin of the inductor L10 is electrically connected to the second pin of the inductor L8. The first pin of the inductor L10 is electrically connected to a DC positive terminal of an IGBT T10. A DC negative terminal of the IGBT T10 is electrically connected to a negative terminal of the capacitor C5. A positive terminal of the capacitor C6 is electrically connected to a first pin of an inductor L11. A second pin of the inductor L11 is electrically connected to a DC positive terminal of an IGBT T11. A DC negative terminal of the IGBT T11 is electrically connected to a first pin of an inductor L12. A second pin of the inductor L12 is electrically connected to the second pin of the inductor L10. The first pin of the inductor L12 is electrically connected to a DC positive terminal of an IGBT T12. A DC negative terminal of the IGBT T12 is electrically connected to a negative terminal of the capacitor C6.

Further, an electrical wiring terminal of the sub-module includes a DC positive terminal, a DC negative terminal, an alternating current (AC) terminal, an upper half-bridge gate, an upper half-bridge emitter, a lower half-bridge gate, and a lower half-bridge emitter.

Further, the upper half-bridge IGBT and the lower half-bridge IGBT each are composed of a plurality of parallel half-bridge IGBTs.

Further, a heat dissipation surface of the half-bridge IGBT is connected to a heat sink.

Further, a combination of the sub-module and the heat sink adopts an annular layout and is structurally symmetrical.

Further, a drive board is disposed inside a ring constituted by the multiple sub-modules, and the drive board is electrically connected to an upper half-bridge gate, an upper half-bridge emitter, a lower half-bridge gate, and a lower half-bridge emitter of each of the sub-modules.

Further, a DC positive terminal of the sub-module is electrically connected to a DC positive terminal of a collecting busbar.

Further, a DC negative terminal of the sub-module is electrically connected to a DC negative terminal of a collecting busbar.

Further, an AC terminal of the sub-module is electrically connected to an AC terminal of a collecting busbar.

The present disclosure has the following advantages: According to the modular parallel half-bridge integrated assembly with an annular layout, the multiple sub-modules adopt the annular layout and are connected in parallel to ensure that parasitic inductance of a commutation loop in each sub-module is the same and parasitic inductance of an AC loop in each sub-module is the same, so as to balance currents of the sub-modules to further improve a capacity of the assembly. In addition, because each sub-module is structurally compact and the parasitic inductance of the commutation loop is small, a switching speed of the assembly is fast and voltage stress is small, which greatly improves application reliability of the assembly.

BRIEF DESCRIPTION OF THE DRAWINGS

To describe the technical solutions in the embodiments of the present disclosure or in the prior art more clearly, the accompanying drawings required for the embodiments are briefly described below. It will become apparent that the accompanying drawings in the following description show merely some embodiments of the present disclosure, and persons of ordinary skill in the art may still derive other drawings from these accompanying drawings without creative efforts.

DETAILED DESCRIPTION OF THE EMBODIMENTS

The technical solutions of the embodiments of the present disclosure are clearly and completely described below with reference to the accompanying drawings. It will become apparent that the described embodiments are merely a part rather than all of the embodiments of the present disclosure. All other embodiments obtained by those having ordinary skill in the art based on the embodiments of the present disclosure shall fall within the protection scope of the present disclosure.

Figure 1:
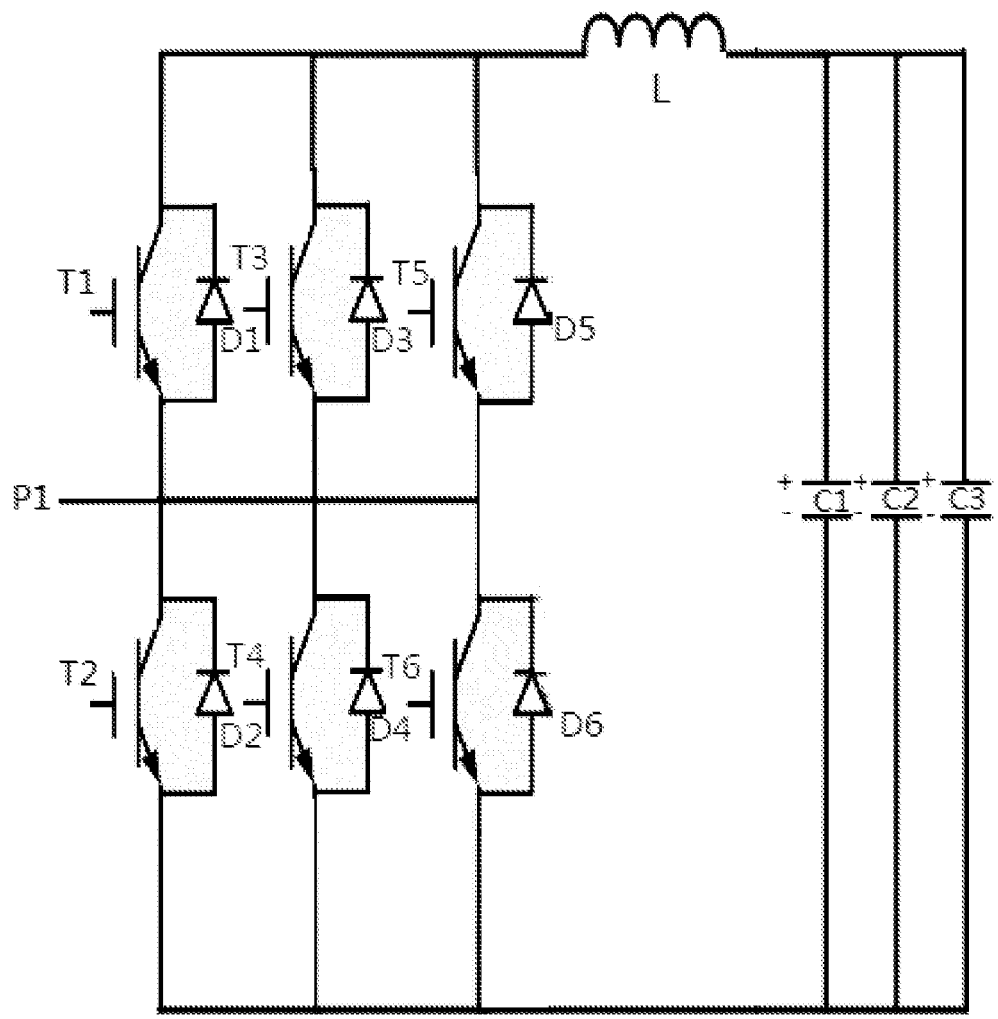
FIG. 1 is a schematic circuit diagram of a traditional centralized layout of a modular parallel half-bridge integrated assembly with an annular layout according to an embodiment of the present disclosure, where T1 to T6 represent IGBTs, D1 to D6 represent diodes, C1 to C3 represent capacitors, and P1 represents an electrical node.
Figure 2:
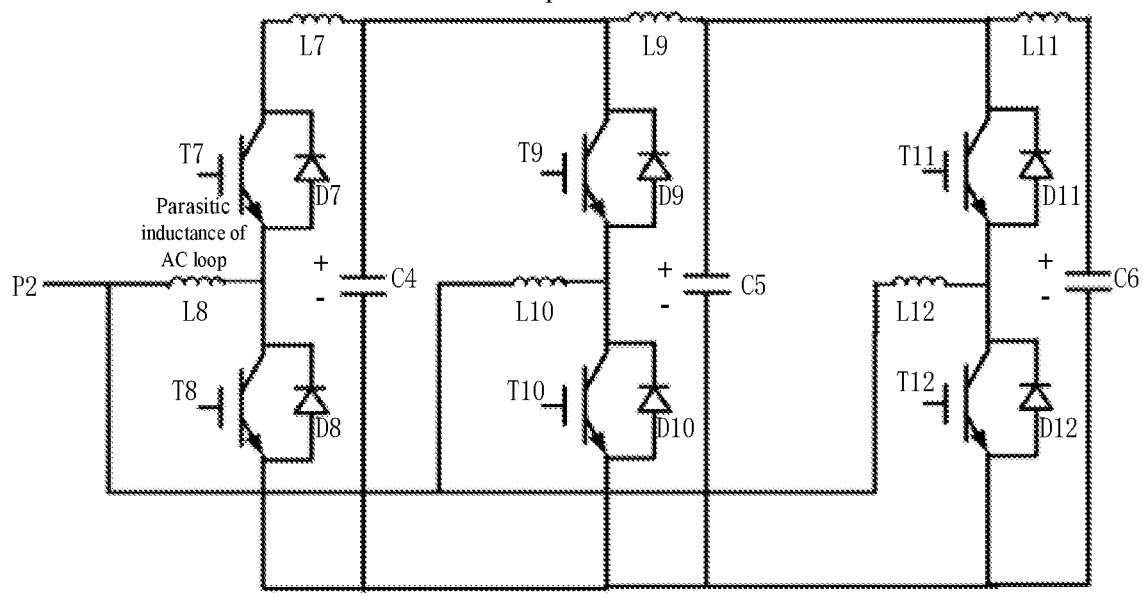
FIG. 2 is a schematic circuit diagram of a modular parallel half-bridge integrated assembly with an annular layout according to an embodiment of the present disclosure, where T7 to T12 represent IGBTs, D7 to D12 represent diodes, C4 to C6 represent capacitors, and P2 represents an electrical node.

As shown in FIG. 2, a modular parallel half-bridge integrated assembly with an annular layout according to an embodiment of the present disclosure includes capacitors C4, C5, and C6, and sub-modules. The sub-modules each include an upper half-bridge IGBT, a lower half-bridge IGBT, and DC capacitors. A positive terminal of the capacitor C4 is electrically connected to a first pin of an inductor L7. A second pin of the inductor L7 is electrically connected to a DC positive terminal of an IGBT T7. A DC negative terminal of the IGBT T7 is electrically connected to a first pin of an inductor L8. A second pin of the inductor L8 is electrically connected to an electrical node P2. The first pin of the inductor L8 is electrically connected to a DC positive terminal of an IGBT T8, and a DC negative terminal of the IGBT T8 is electrically connected to a negative terminal of the capacitor C4. A positive terminal of the capacitor C5 is electrically connected to a first pin of an inductor L9. A second pin of the inductor L9 is electrically connected to a DC positive terminal of an IGBT T9. A DC negative terminal of the IGBT T9 is electrically connected to a first pin of an inductor L10. A second pin of the inductor L10 is electrically connected to the second pin of the inductor L8. The first pin of the inductor L10 is electrically connected to a DC positive terminal of an IGBT T10, and a DC negative terminal of the IGBT T10 is electrically connected to a negative terminal of the capacitor C5. A positive terminal of the capacitor C6 is electrically connected to a first pin of an inductor L11. A second pin of the inductor L11 is electrically connected to a DC positive terminal of an IGBT T11. A DC negative terminal of the IGBT T11 is electrically connected to a first pin of an inductor L12. A second pin of the inductor L12 is electrically connected to the second pin of the inductor L10. The first pin of the inductor L12 is electrically connected to a DC positive terminal of an IGBT T12, and a DC negative terminal of the IGBT T12 is electrically connected to a negative terminal of the capacitor C6.

Figure 4:
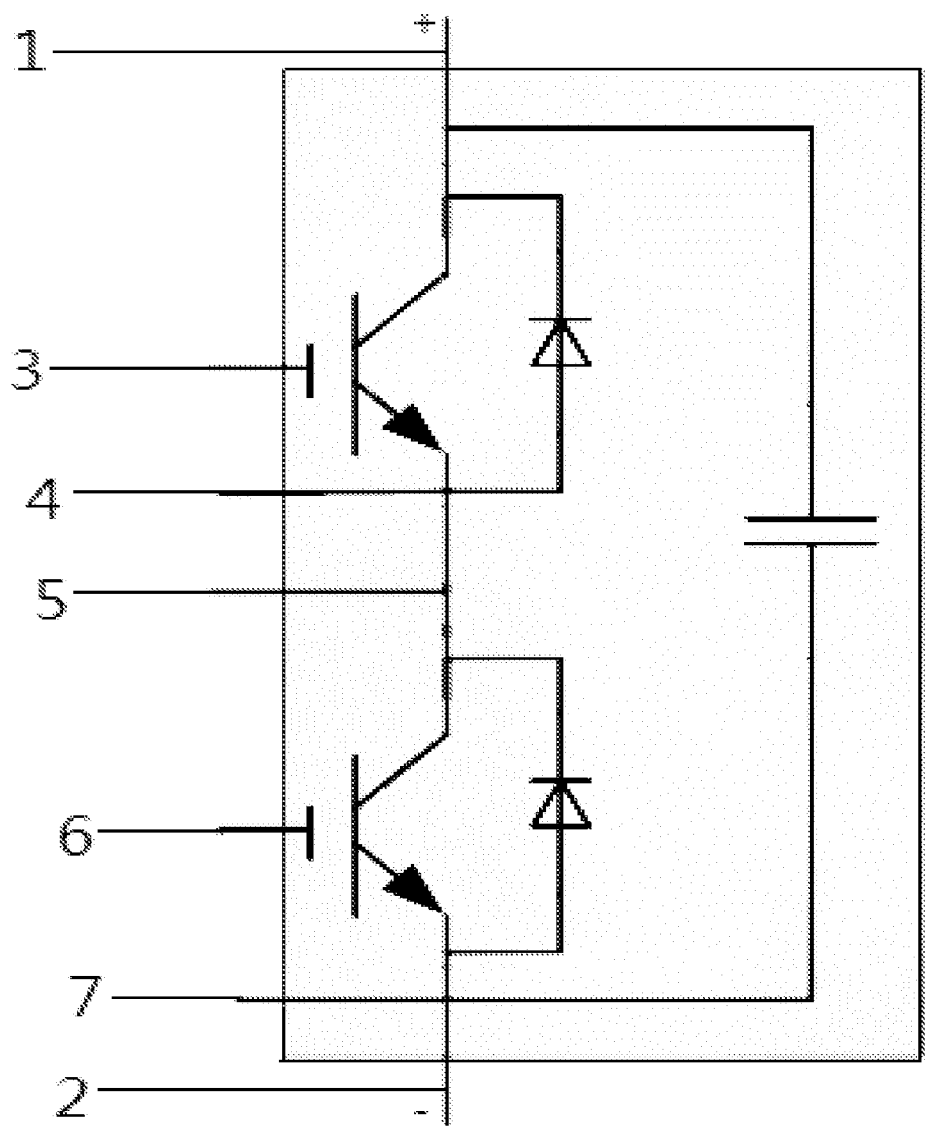
FIG. 4 is a circuit diagram of a sub-module of a modular parallel half-bridge integrated assembly with an annular layout according to an embodiment of the present disclosure.

As shown in FIG. 4, in this embodiment, an electrical wiring terminal of the sub-module includes a DC positive terminal, a DC negative terminal, an AC terminal, an upper half-bridge gate, an upper half-bridge emitter, a lower half-bridge gate, and a lower half-bridge emitter.

As shown in FIG. 1 to FIG. 4, in this embodiment, the upper half-bridge IGBT and the lower half-bridge IGBT each are composed of a plurality of parallel half-bridge IGBTs.

Figure 3:
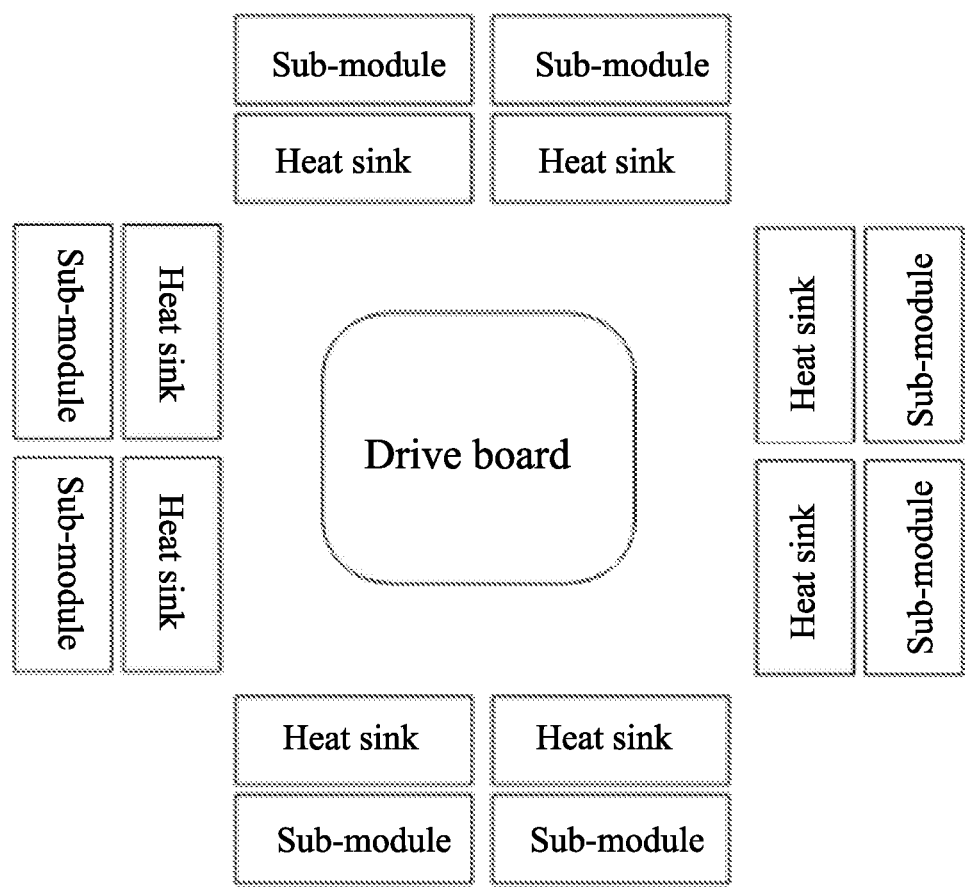
FIG. 3 is a schematic top view of a modular parallel half-bridge integrated assembly with an annular layout according to an embodiment of the present disclosure.

As shown in FIG. 3, in this embodiment, a heat dissipation surface of the half-bridge IGBT is connected to a heat sink.

As shown in FIG. 3, in this embodiment, a combination of the sub-module and the heat sink adopts an annular layout and is structurally symmetrical.

Figure 5:
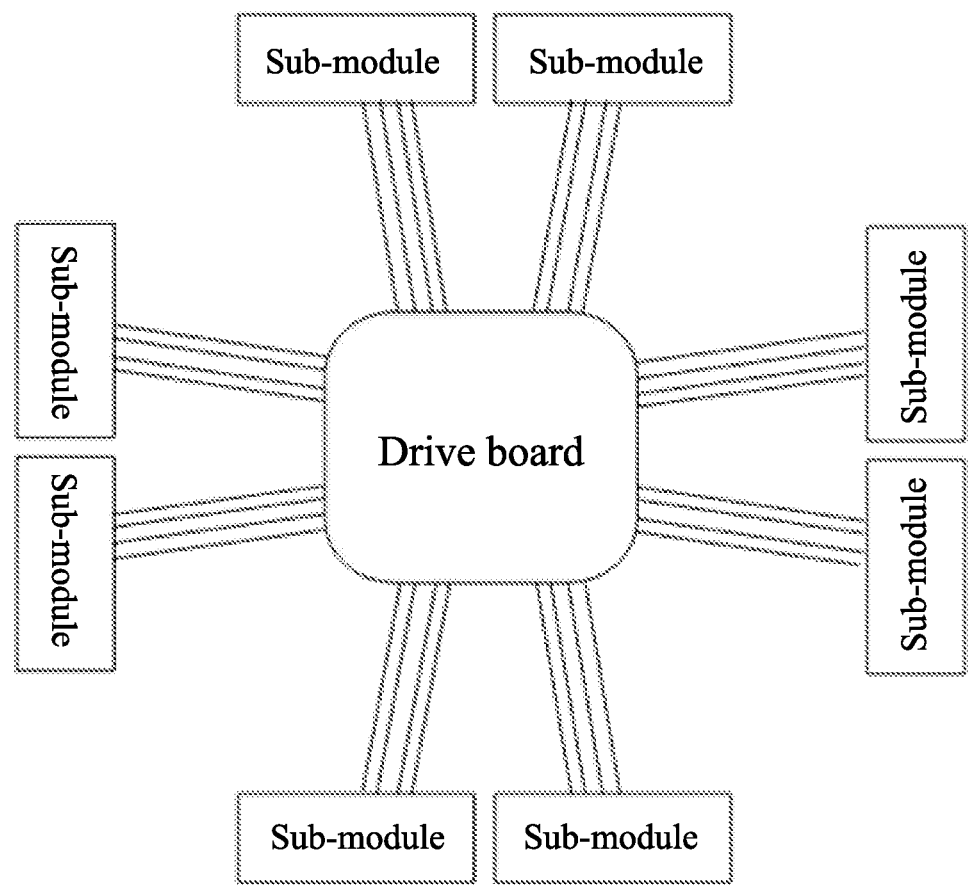
FIG. 5 is a schematic structural diagram showing a connection between a sub-module and a drive board in a modular parallel half-bridge integrated assembly with an annular layout according to an embodiment of the present disclosure.

As shown in FIG. 5, in this embodiment, a drive board is disposed inside a ring constituted by multiple sub-modules, and the drive board is electrically connected to an upper half-bridge gate, an upper half-bridge emitter, a lower half-bridge gate, and a lower half-bridge emitter of each of the sub-modules.

Figure 7:
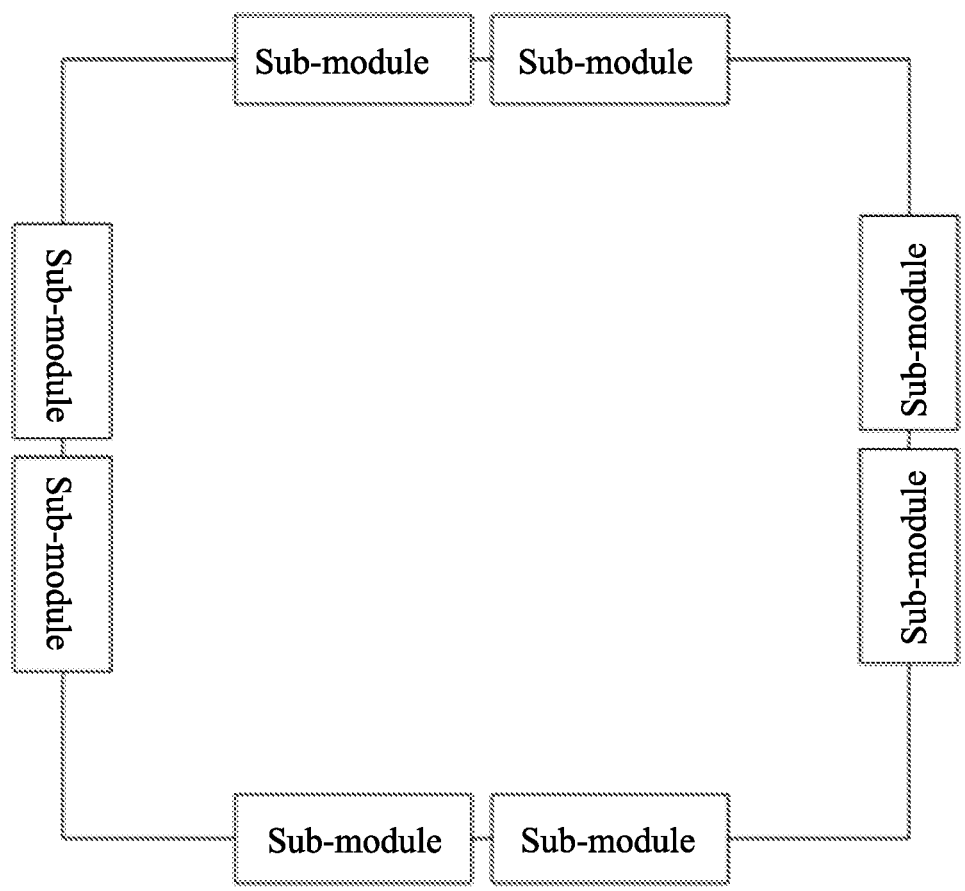
FIG. 7 is a schematic structural diagram showing a connection between a sub-module and each of a DC positive collecting busbar and a DC negative collecting busbar in a modular parallel half-bridge integrated assembly with an annular layout according to an embodiment of the present disclosure.

As shown in FIG. 7, in this embodiment, a DC positive terminal of the sub-module is electrically connected to a DC positive terminal of a collecting busbar.

As shown in FIG. 7, in this embodiment, a DC negative terminal of the sub-module is electrically connected to a DC negative terminal of a collecting busbar.

Figure 6:
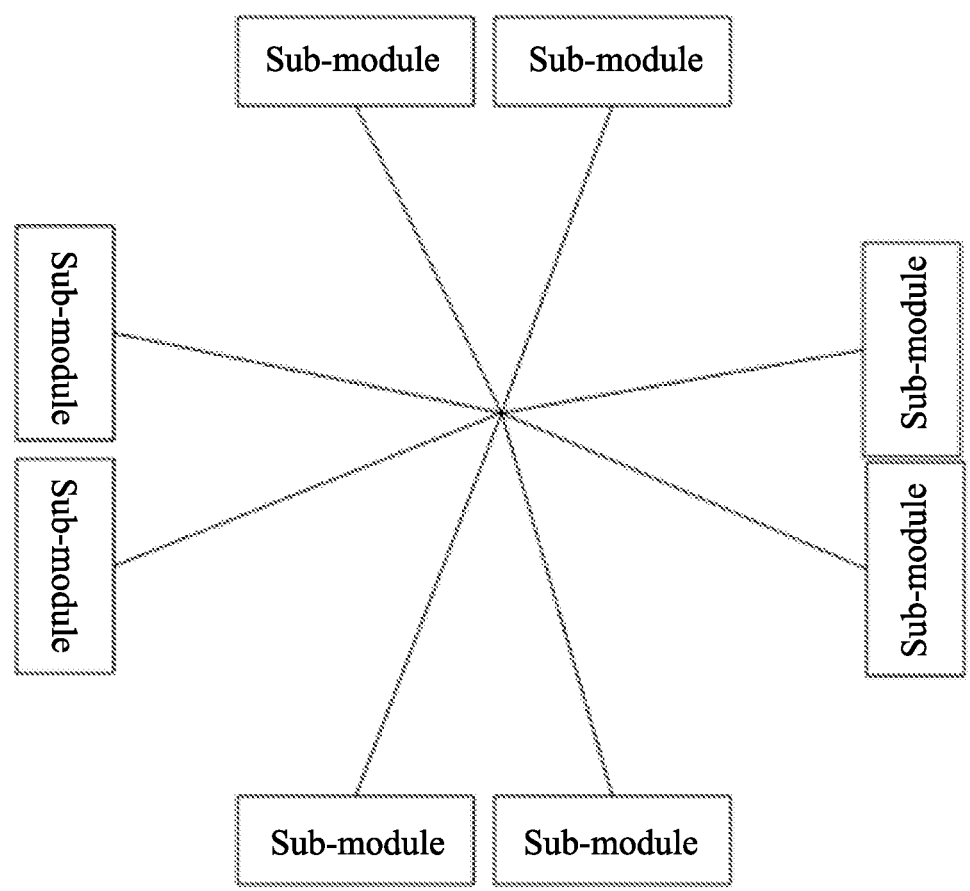
FIG. 6 is a schematic structural diagram of connecting an AC terminal of a sub-module in a modular parallel half-bridge integrated assembly with an annular layout according to an embodiment of the present disclosure.

As shown in FIG. 6, in this embodiment, an AC terminal of the sub-module is electrically connected to an AC terminal of a collecting busbar.

In order to facilitate further understanding of the above technical solutions, structural principles of the assembly are described as follows:

As shown in FIGS. 1 to 7, the modular parallel half-bridge integrated assembly with an annular layout adopts a symmetrical layout or an annular layout. Therefore, parasitic inductance of a commutation loop in each sub-module is the same, and parasitic inductance of an AC loop in each sub-module is the same. The parasitic inductance is a main factor of balancing currents of the sub-modules, and the same inductance means that the currents of the sub-modules are the same. In addition, the size of the parasitic inductance is directly determined by the length of the loop. Because each IGBT and each capacitor are small in size, the parasitic inductance of the commutation loop is small through close combination, realizing a small voltage overshoot and a fast switching speed for the IGBT. The sub-modules are arranged as a quadrangle to ensure that the parasitic inductance of the commutation loop in each sub-module is the same and the parasitic inductance of the AC loop in each sub-module is the same, so as to balance the currents of the sub-modules.

As shown in FIG. 3, the integrated assembly is composed of eight parallel sub-modules. An improvement is that the half-bridge integrated assembly includes four sub-modules, four heat sinks, and one drive board, which are connected together by using the DC positive terminal, the DC negative terminal, the collecting busbar, and the AC collecting busbar. The sub-module is composed of the upper half-bridge IGBT, the lower half-bridge IGBT, the DC capacitors, and other auxiliary components. The upper and lower half-bridge IGBTs each are composed of a plurality of parallel IGBTs.

As shown in FIG. 4, the sub-module includes seven electrical wiring terminals, namely, the DC positive terminal, the DC negative terminal, the AC terminal, the upper half-bridge gate, the upper half-bridge emitter, the lower half-bridge gate, and the lower half-bridge emitter. The heat sink is used together with the sub-module and connected to a heat dissipation surface of each IGBT of the sub-module. The heat sink dissipates heat through hydrocooling or air cooling. The combination of the sub-module and the heat sink adopts a quadrilateral layout and is structurally symmetrical.

As shown in FIG. 5, the drive board is connected to the upper half-bridge gate, the upper half-bridge emitter, the lower half-bridge gate, and the lower half-bridge emitter of each sub-module.

As shown in FIG. 7, a DC positive collecting busbar is separately connected to the DC positive terminal of each sub-module to form a quadrilateral structure. A DC negative collecting busbar is separately connected to the DC negative terminal of each sub-module to form a quadrilateral structure.

What is described above is merely exemplary embodiments of the present disclosure, but not intended to limit the present disclosure. Any modifications, equivalent substitutions, improvements and the like made without departing from the spirit and principles of the present disclosure fall within the protection scope of the present disclosure.

What is claimed is:

1. A modular parallel half-bridge integrated assembly with an annular layout, comprising sub-modules,
   wherein the sub-modules each comprise an upper half-bridge insulated gate bipolar transistor (IGBT), a lower half-bridge IGBT, and direct current (DC) capacitors,
   wherein the DC capacitors comprises a first capacitor, a second capacitor, and a third capacitor, a positive terminal of the first capacitor is electrically connected to a first pin of a first inductor, a second pin of the first inductor is electrically connected to a DC positive terminal of a first IGBT of the upper half-bridge IGBT, a DC negative terminal of the first IGBT of the upper half-bridge IGBT is electrically connected to a first pin of a second inductor, a second pin of the second inductor is electrically connected to an electrical node, the first pin of the second inductor is electrically connected to a DC positive terminal of a second IGBT of the lower half-bridge IGBT, and a DC negative terminal of the second IGBT of the lower half-bridge IGBT is electrically connected to a negative terminal of the first capacitor;
   a positive terminal of the second capacitor is electrically connected to a first pin of a third inductor, a second pin of the third inductor is electrically connected to a DC positive terminal of a third IGBT of the upper half-bridge IGBT, a DC negative terminal of the third IGBT of the upper half-bridge IGBT is electrically connected to a first pin of a fourth inductor, a second pin of the fourth inductor is electrically connected to the second pin of the second inductor, the first pin of the fourth inductor is electrically connected to a DC positive terminal of a fourth IGBT of the lower half-bridge IGBT, and a DC negative terminal of the fourth IGBT of the lower half-bridge IGBT is electrically connected to a negative terminal of the second capacitor; and
   a positive terminal of the third capacitor is electrically connected to a first pin of a fifth inductor, a second pin of the fifth inductor is electrically connected to a DC positive terminal of a fifth IGBT of the upper half-bridge IGBT, a DC negative terminal of the fifth IGBT of the upper half-bridge IGBT is electrically connected to a first pin of a sixth inductor, a second pin of the sixth inductor is electrically connected to the second pin of the fourth inductor, the first pin of the sixth inductor is electrically connected to a DC positive terminal of a sixth IGBT of the lower half-bridge IGBT, and a DC negative terminal of the sixth IGBT of the lower half-bridge IGBT is electrically connected to a negative terminal of the third capacitor.

2. The modular parallel half-bridge integrated assembly according to claim 1, wherein an electrical wiring terminal of each of the sub-modules comprises a DC positive terminal, a DC negative terminal, an alternating current (AC) terminal, an upper half-bridge gate, an upper half-bridge emitter, a lower half-bridge gate, and a lower half-bridge emitter.

3. The modular parallel half-bridge integrated assembly according to claim 1, wherein the upper half-bridge IGBT and the lower half-bridge IGBT each comprise a plurality of parallel half-bridge IGBTs.

4. The modular parallel half-bridge integrated assembly according to claim 1, wherein each of a heat dissipation surface of the upper half-bridge IGBT and a heat dissipation surface of the lower half-bridge IGBT is connected to a heat sink.

5. The modular parallel half-bridge integrated assembly according to claim 4, wherein a combination of the sub-modules and the heat sink is configured in the annular layout, and the combination is structurally symmetrical.

6. The modular parallel half-bridge integrated assembly according to claim 1, wherein a drive board is configured inside a ring constituted by the sub-modules, and the drive board is electrically connected to an upper half-bridge gate of each of the sub-modules, an upper half-bridge emitter of each of the sub-modules, a lower half-bridge gate of each of the sub-modules, and a lower half-bridge emitter of each of the sub-modules.

7. The modular parallel half-bridge integrated assembly according to claim 1, wherein a DC positive terminal of each of the sub-modules is electrically connected to a DC positive terminal of a collecting busbar.

8. The modular parallel half-bridge integrated assembly according to claim 1, wherein a DC negative terminal of each of the sub-modules is electrically connected to a DC negative terminal of a collecting busbar.

9. The modular parallel half-bridge integrated assembly according to claim 1, wherein an AC terminal of each of the sub-modules is electrically connected to an AC terminal of a collecting busbar.

\* \* \* \* \*